(12) United States Patent
Nosaka (10) Patent No.: US 10,158,341 B2
(45) Date of Patent: Dec. 18, 2018

(54) FILTER DEVICE

(71) Applicant: Murata Manufacturing Co., Ltd., Nagaokakyo-shi, Kyoto-fu (JP)

(72) Inventor: Koji Nosaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 45 days.

(21) Appl. No.: 15/633,850

(22) Filed: Jun. 27, 2017

(65) Prior Publication Data

US 2017/0294896 A1 Oct. 12, 2017

Related U.S. Application Data

(63) Continuation of application No. PCT/JP2016/051825, filed on Jan. 22, 2016.

(30) Foreign Application Priority Data

Jan. 23, 2015 (JP) .................. 2015-011610

(51) Int. Cl.
*H03H 9/70* (2006.01)
*H03H 9/72* (2006.01)
*H03H 9/64* (2006.01)

(52) U.S. Cl.
CPC ............ *H03H 9/64* (2013.01); *H03H 9/6483* (2013.01); *H03H 9/70* (2013.01); *H03H 9/72* (2013.01)

(58) Field of Classification Search
CPC ........................ H09H 9/70–9/72; H09H 9/46
USPC ................................. 333/193–196
See application file for complete search history.

(56) References Cited

U.S. PATENT DOCUMENTS

| 7,164,306 B2* | 1/2007 | Makino ................. H03H 7/463 327/407 |
| 7,546,091 B2* | 6/2009 | Murakami .............. H03H 7/38 333/100 |
| 7,573,354 B2* | 8/2009 | Nishihara .............. H03H 9/605 333/133 |
| 9,742,451 B2* | 8/2017 | Yatsenko ............. H04B 1/1036 |
| 9,893,713 B2* | 2/2018 | Yatsenko ............. H03H 9/542 |
| 2004/0116098 A1 | 6/2004 | Ochii et al. |

(Continued)

FOREIGN PATENT DOCUMENTS

| JP | 2000-216661 A | 8/2000 |
| JP | 2004-194240 A | 7/2004 |

(Continued)

OTHER PUBLICATIONS

Official Communication issued in International Patent Application No. PCT/JP2016/051825, dated Apr. 12, 2016.

*Primary Examiner* — Dean Takaoka
*Assistant Examiner* — Alan Wong
(74) *Attorney, Agent, or Firm* — Keating & Bennett, LLP (57) ABSTRACT

A filter device includes first, second and third filter circuits that are connected to a common terminal. The first filter circuit includes a first inductor that is closest to the common terminal along a first signal line and a first capacitance element that is connected in parallel with the first inductor, the second filter circuit includes a series arm resonator, which is a second acoustic resonator, that is closest to the common terminal along a second signal line, and the third filter circuit includes a third acoustic resonator that is closest to the common terminal along a third signal line.

18 Claims, 5 Drawing Sheets

(56) References Cited

U.S. PATENT DOCUMENTS

| | | |
|---|---|---|
| 2005/0281210 A1 | 12/2005 | Makino |
| 2006/0067254 A1* | 3/2006 | Mahbub .............. H03H 9/0576 |
| | | 370/282 |
| 2015/0222247 A1* | 8/2015 | Watanabe ............. H03H 9/725 |
| | | 333/129 |
| 2017/0194939 A1* | 7/2017 | Mukai ...................... H03H 9/64 |
| 2017/0214390 A1* | 7/2017 | Tsukamoto ............ H03H 9/542 |
| 2017/0257078 A1* | 9/2017 | Leipold ................... H03H 7/09 |

FOREIGN PATENT DOCUMENTS

| | | |
|---|---|---|
| JP | 2006-086871 A | 3/2006 |
| JP | 2008-294780 A | 12/2008 |
| JP | 2011-211347 A | 10/2011 |

* cited by examiner

FILTER DEVICE

CROSS REFERENCE TO RELATED APPLICATIONS

This application claims the benefit of priority to Japanese Patent Application No. 2015-011610 filed on Jan. 23, 2015 and is a Continuation Application of PCT Application No. PCT/JP2016/051825 filed on Jan. 22, 2016. The entire contents of each application are hereby incorporated herein by reference.

BACKGROUND OF THE INVENTION

1. Field of the Invention

The present invention relates to a filter device that includes first, second and third filter circuits that are connected to a common terminal.

2. Description of the Related Art

In the related art, a splitter that splits a signal into three signals of different frequency bands is used in cellular phone devices and other devices. Japanese Unexamined Patent Application Publication No. 2004-194240 discloses a three-way splitter in which first to third filters F1 to F3 are connected to an antenna terminal. The first filter F1 is a low pass filter in which a first frequency band is a pass band and second and third frequency bands are attenuation bands. In the second filter F2, the second frequency band is a pass band and first and third frequency bands are attenuation bands. In addition, the second filter F2 is a band pass filter that includes a SAW filter. The third filter F3 is formed of an LC filter and in the third filter F3, the third frequency band is a pass band and first and second frequency bands are attenuation bands.

In the three-way splitter disclosed in Japanese Unexamined Patent Application Publication No. 2004-194240, the first to third filters F1 to F3 are commonly connected to the antenna terminal. Consequently, it has been necessary to provide impedance matching circuits at the sides of the first and third filters formed of LC filters.

SUMMARY OF THE INVENTION

Preferred embodiments of the present invention provide filter devices that enable impedance matching circuits to be omitted.

A filter device according to a preferred embodiment of the present invention includes a common terminal; a first filter circuit that includes a first signal line that is connected to the common terminal and is a low pass filter with a first pass band; a second filter circuit that includes a second signal line that is connected to the common terminal and is a band pass filter with a second pass band that is located at a higher frequency than the first pass band of the first filter circuit; and a third filter circuit that includes a third signal line that is connected to the common terminal and includes a third pass band that is located at a higher frequency than the second pass band of the second filter circuit; wherein the first filter circuit includes a first inductor that is closest to the common terminal along the first signal line and a first capacitance element that is connected in parallel with the first inductor and defines an LC resonance circuit, the second filter circuit includes a second acoustic resonator that is closest to the common terminal along the second signal line, and the third filter circuit includes a third acoustic resonator that is closest to the common terminal along the third signal line.

In a filter device according to a preferred embodiment of the present invention, the first filter circuit includes a first acoustic resonator that has an anti-resonant frequency and a resonant frequency, the resonant frequency being located inside the second pass band, and a second capacitance element that is connected between the first signal line and a ground potential. In this case, attenuation in the second pass band is able to be made sufficiently large in the first filter circuit.

In another filter device according to another preferred embodiment of the present invention, the second capacitance element of the first filter circuit is defined by an acoustic resonator, the second filter circuit includes a parallel arm that connects the second signal line, which is a series arm, and the ground potential, and an acoustic resonator is provided in the parallel arm, and a resonant frequency of the acoustic resonator that defines the second capacitance element of the first filter circuit and a resonant frequency of the acoustic resonator provided in the parallel arm of the second filter circuit are the same or substantially the same as a resonant frequency of the second acoustic resonator. In this case, loss is able to be further reduced and attenuation in the vicinities of the pass bands of the first to third filter circuits is able to be further increased.

In yet another preferred embodiment of the present invention, the resonant frequency of the second acoustic resonator, the resonant frequency of the acoustic resonator that defines the second capacitance element of the first filter circuit and the resonant frequency of the acoustic resonator provided in the parallel arm of the second filter circuit preferably fall within a range of about ±5% of an average value of the resonant frequencies of these acoustic resonators. In this case, loss is able to be further reduced and attenuation in the vicinities of the pass bands of the first to third filter circuits is able to be further increased.

In yet another preferred embodiment of the present invention, the second filter circuit is preferably a ladder filter that includes the second acoustic resonator and a fourth acoustic resonator that is provided in a parallel arm that connects the second signal line and the ground potential. In this case, the steepness of the filter characteristic of the second filter circuit is able to be increased.

In yet another preferred embodiment of the present invention, the third filter circuit is preferably an LC filter that includes a second inductor that is connected between the third signal line and the ground potential, and a third capacitance element that is connected in series with the second inductor. In this case, the third filter circuit is able to be reduced in size.

In a preferred embodiment of the present invention, the third filter circuit may preferably be a band pass filter. In such a case, a signal of a specific frequency band is able to be transmitted or received using the third filter circuit. It is preferable that a ladder filter be used as the band pass filter. In this case, the steepness of the filter characteristic of the third filter circuit is able to be increased.

In yet another preferred embodiment of the present invention, at least one of the first to third acoustic resonators is preferably an elastic wave resonator. In this case the steepness of the filter characteristic is able to be further increased. Surface acoustic wave resonators may be suitably used as the elastic wave resonators. In the case where surface acoustic wave resonators are used, the steepness of the filter characteristics is able to be further increased.

In yet another preferred embodiment of the present invention, the first capacitance element is preferably defined by of an acoustic resonator. Thus, the first capacitance element may be provided by utilizing the capacitance of the acoustic resonator. In this case, the attenuation is also able to be increased by setting the resonant frequency of the acoustic resonator to the frequency of the attenuation band.

With the filter devices according to various preferred embodiments of the present invention, an impedance matching circuit is able to be omitted in a configuration in which first, second and third filter circuits are connected to a common terminal.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, the present invention will be clarified by describing specific preferred embodiments of the present invention with reference to the drawings.

The preferred embodiments described in the present specification are illustrative examples and it should be noted that portions of the configurations, features, elements, etc. illustrated in different preferred embodiments may be substituted for one another or combined with one another.

Figure 1:
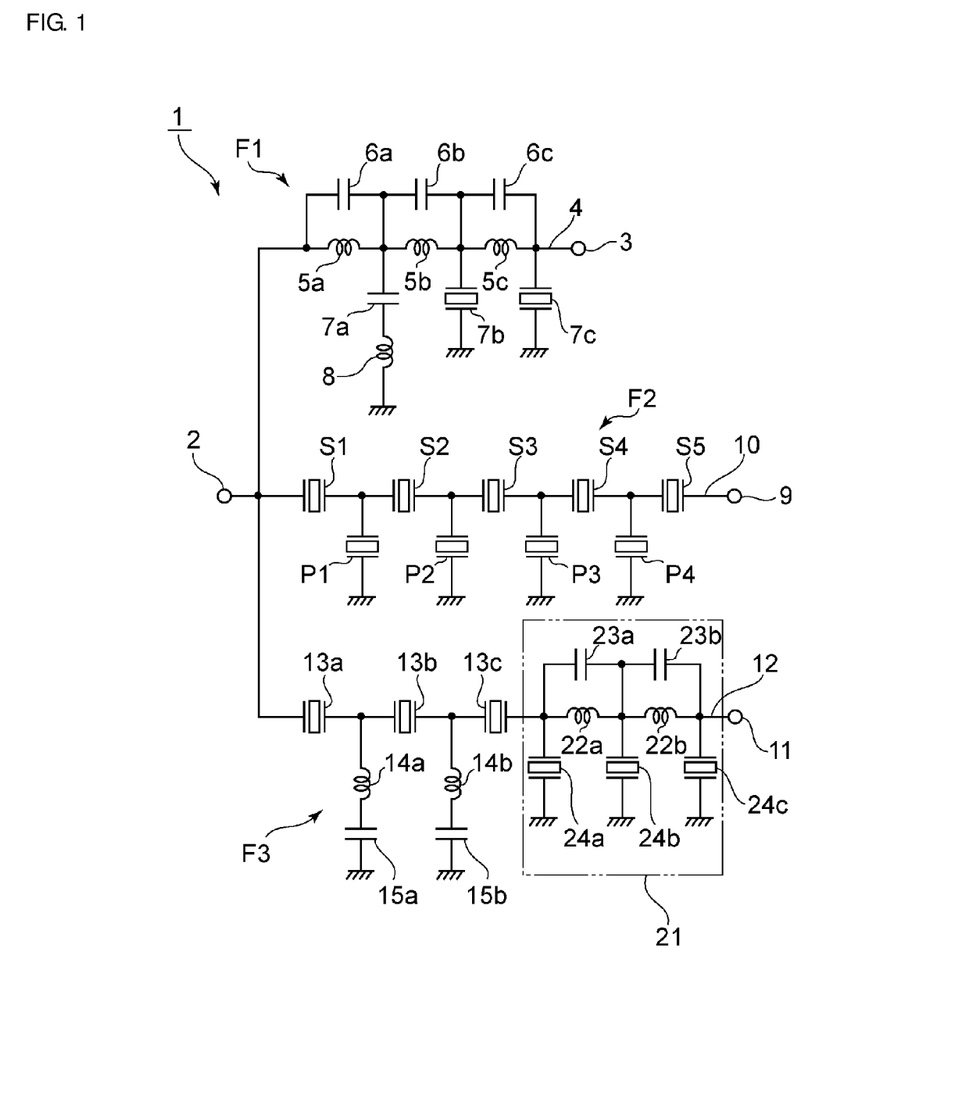
FIG. 1 is a circuit diagram of a filter device according to a first preferred embodiment of the present invention.

FIG. 1 is a circuit diagram of a filter device according to a first preferred embodiment of the present invention.

A filter device 1 includes a common terminal 2. One end of each of first, second and third filter circuits F1, F2 and F3 is commonly connected to the common terminal 2. The first, second and third filter circuits F1 to F3 respectively have the following first, second and third pass bands f1, f2 and f3, for example.

f1: low-band cellular band, about 699 MHz to about 960 MHz.

f2: GPS, GLONASS and BEIDOU band, about 1559 MHz to about 1608 MHz.

f3: middle-band cellular band, about 1700 MHz to about 2170 MHz.

The first filter circuit F1 preferably is a low pass filter that includes LC resonators and acoustic resonators. The first filter circuit F1 includes the first pass band f1, which is a low-band cellular band, and since the first filter circuit F1 is preferably a low pass filter, the first filter circuit F1 allows signals of a band of about 960 MHz and lower to pass therethrough. In other words, the first pass band f1 is preferably set such that a low-band cellular band of about 699 MHz to about 960 MHz is allowed to pass, for example. In addition, the second filter circuit F2 preferably is a band pass filter that includes acoustic resonators and is defined by a ladder filter.

The third filter circuit F3 preferably is a high pass filter that includes LC resonators and acoustic resonators. The third filter circuit F3 is preferably a high pass filter and allows signals having a frequency of about 1700 MHz and higher, which is the lower limit of the third pass band f3, to pass therethrough.

In more detail, the first filter circuit F1 includes a first signal line 4 that connects the common terminal 2 and a first terminal 3. A plurality of first inductors 5a to 5c are provided along the first signal line 4. The plurality of first inductors 5a to 5c are connected in series along the first signal line 4.

First capacitance elements 6a to 6c are respectively connected in parallel with the first inductors 5a to 5c. In addition, a second capacitance element 7a, which provides impedance adjustment, is connected between a connection point between the first inductor 5a and the first inductor 5b, and the ground potential. The second capacitance element 7a is preferably defined by a capacitor. An inductor 8 is connected in series with the second capacitance element 7a, which provides impedance adjustment. In addition, a first acoustic resonator, which defines and functions as a second capacitance element 7b, is connected between a connection point between the first inductor 5b and the first inductor 5c, and the ground potential.

The first acoustic resonator, which functions as the second capacitance element 7b, has a resonant frequency and an anti-resonant frequency. In this preferred embodiment, the second capacitance element 7b is defined by a surface acoustic wave resonator. The surface acoustic wave resonator is used as the second capacitance element 7b by utilizing the capacitance of the surface acoustic wave resonator. A first acoustic resonator, which is preferably the same or substantially the same as the second capacitance element 7b and functions as a second capacitance element 7c, is connected between a connection point between the first inductor 5c and the first terminal 3, and the ground potential.

As described above, the closest element to the common terminal 2 in the first filter circuit F1 is the first inductor 5a. The second capacitance elements 7a to 7c in the first filter circuit F1 are capacitance elements that provide impedance adjustment. The two second capacitance elements 7b and 7c are preferably defined by the first acoustic resonators as described above and the resonant frequencies thereof are located in the pass band f2 of the second filter circuit F2. Therefore, a signal in the pass band of the second filter circuit F2 is allowed to flow to the ground potential.

The second filter circuit F2 includes a second signal line 10 that connects the common terminal 2 and a second terminal 9. Series arm resonators S1, S2, S3, S4 and S5 are provided along the second signal line 10 in this order from the common terminal 2 side. In other words, the second signal line 10 defines a series arm and the series arm resonators S1 to S5 are connected in series with each other along the series arm. The series arm resonators S1 to S5 are each preferably defined by a surface acoustic wave resonator. The series arm resonators S1 to S5 correspond to second acoustic resonators including a resonant frequency and an anti-resonant frequency.

A parallel arm resonator P1 is provided in a parallel arm that connects a connection point between the series arm resonator S1 and the series arm resonator S2, and the ground potential. A parallel arm resonator P2 is provided in a parallel arm that connects a connection point between the series arm resonator S2 and the series arm resonator S3, and the ground potential. A parallel arm resonator P3 is provided in a parallel arm that connects a connection point between the series arm resonator S3 and the series arm resonator S4, and the ground potential. A parallel arm resonator P4 is provided in a parallel arm that connects a connection point between the series arm resonator S4 and the series arm resonator S5, and the ground potential. The parallel arm resonators P1 to P4 are also preferably defined by surface acoustic wave resonators, for example.

The second filter circuit F2 is preferably a ladder filter that includes the series arm resonators S1 to S5 and the parallel arm resonators P1 to P4. The second filter circuit F2 is a band pass filter and the center frequency of the pass band thereof is located in the above-described pass band f2.

The resonant frequencies of the series arm resonators S1 to S5 are located inside the pass band f2 and the anti-resonant frequencies of the parallel arm resonators P1 to P4 are located inside the pass band f2.

The closest element to the common terminal 2 along the second signal line 10 in the second filter circuit F2 is the second acoustic resonator that is the series arm resonator S1.

The third filter circuit F3 includes a third signal line 12 that connects the common terminal 2 and a third terminal 11. A low pass filter 21 is connected between the third filter circuit F3 and the third terminal 11 along the third signal line 12.

The third filter circuit F3 is preferably a high pass filter. The third filter circuit F3 and the low pass filter 21 are connected in series with each other and therefore a pass band is provided by the third filter circuit F3 and the low pass filter 21.

Third acoustic resonators 13a to 13c are provided along the third signal line 12 in the third filter circuit F3. The plurality of third acoustic resonators 13a to 13c are connected in series with each other along the third signal line 12.

A third inductor 14a and a third capacitance element 15a are connected in series with each other between a connection point between the third acoustic resonator 13a and the third acoustic resonator 13b, and the ground potential. Similarly, a third inductor 14b and a third capacitance element 15b are connected in series with each other between a connection point between the third acoustic resonator 13b and the third acoustic resonator 13c, and the ground potential.

The closest element to the common terminal 2 in the third filter circuit F3 is the third acoustic resonator 13a.

In the filter device 1, the closest element to the common terminal 2 in the first filter circuit F1 is the first inductor 5a, and the elements that are closest to the common terminal 2 in the second filter circuit F2 and the third filter circuit F3 are second and third acoustic resonators, respectively, and these elements are arranged along the signal lines. Therefore, it is possible to omit impedance matching circuits that would be provided at the common terminal 2 sides of the first and third filter circuits F1 and F3 defined by LC filters and the second filter circuit F2 that includes acoustic resonators.

The anti-resonant frequencies of the third acoustic resonators 13a to 13c of the third filter circuit F3 are located in the pass band f2 of the second filter circuit F2.

Therefore, a trap is provided in the pass band f2 in the filter characteristic of the third filter circuit F3.

The low pass filter 21 includes fourth inductors 22a and 22b, which are provided along the third signal line 12. Fourth capacitance elements 23a and 23b are respectively connected in parallel with the fourth inductors 22a and 22b. A fifth capacitance element 24a is connected between an end of the fourth inductor 22a on the third filter circuit F3 side and the ground potential. In addition, a fifth capacitance element 24b is connected between a connection point between the fourth inductor 22a and the fourth inductor 22b, and the ground potential. A fifth capacitance element 24c is connected between a connection point between the fourth inductor 22b and the third terminal 11, and the ground potential. The fifth capacitance elements 24a to 24c are each preferably defined by an acoustic resonator and include a resonant frequency and an anti-resonant frequency.

Although the low pass filter 21 does not necessarily have to be provided, a pass band may be provided as described above when the low pass filter 21 is provided.

It is preferable that the resonant frequencies of the fifth capacitance elements 24a to 24c be located in the pass band f2 of the second filter circuit F2. As a result, attenuation in the second pass band is able to be made even larger in the filter circuit between the common terminal 2 and the third terminal 11.

It is preferable that the second capacitance elements 7b and 7c, which are defined by acoustic resonators, the series arm resonators S1 to S5 and the parallel arm resonators P1 to P4, which are included in the second filter circuit F2, the third acoustic resonators 13a to 13c, which are included in the third filter circuit F3; and the acoustic resonators that define the fifth capacitance elements 24a to 24c all have the same or substantially the same resonant frequencies and anti-resonant frequencies. Thus, it is possible to reduce the number of types of acoustic resonator used and it is possible to reduce the cost and to use a common piezoelectric substrate to define the filter device 1. Therefore, it is possible to reduce the size of the filter device 1. In particular, the first, second and third filter circuits F1, F2 and F3 are able to be provided using the same piezoelectric substance.

It is preferable that the second capacitance elements of the first filter circuit be defined by acoustic resonators, that the second filter circuit include parallel arms that connect the second signal line, which is a series arm, and the ground potential, that acoustic resonators be provided in the parallel arms, and that the resonant frequencies of the acoustic resonators that define the second capacitance elements of the first filter circuit and the resonant frequencies of the acoustic resonators that are provided in the parallel arms of the second filter circuit have the same or substantially the same resonant frequency as the second acoustic resonators.

It is preferable that the resonant frequencies of the second acoustic resonators, the acoustic resonators that define the second capacitance elements of the first filter circuit, and the acoustic resonators provided in the parallel arms of the second filter circuit fall within a range of about ±5% of the average value of the resonant frequencies of these acoustic resonators, for example.

Figure 2:
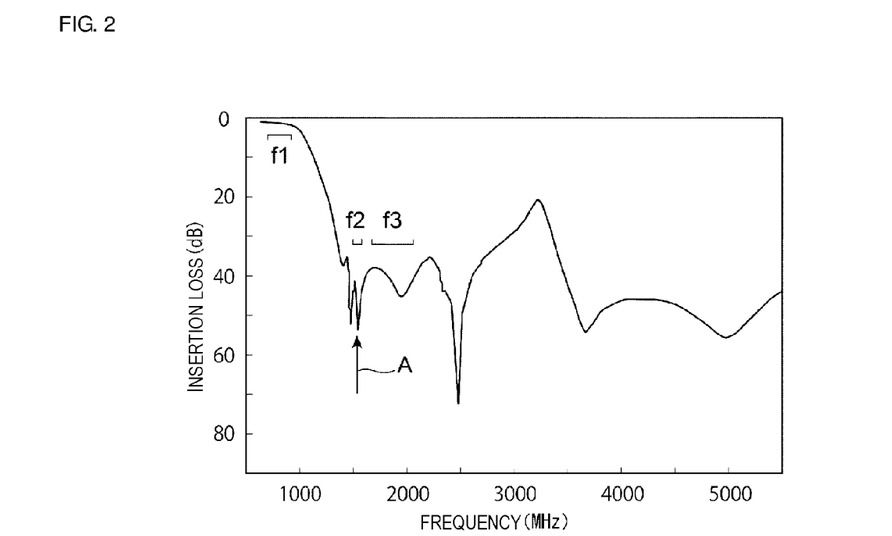
FIG. 2 illustrates a filter characteristic of a first filter circuit of the filter device of the first preferred embodiment of the present invention.
Figure 3:
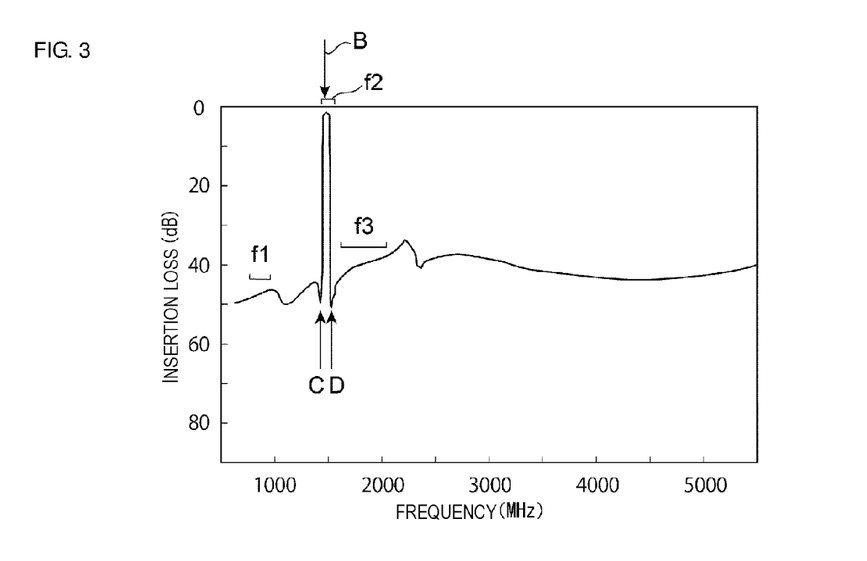
FIG. 3 illustrates a filter characteristic of a second filter circuit of the filter device of the first preferred embodiment of the present invention.
Figure 4:
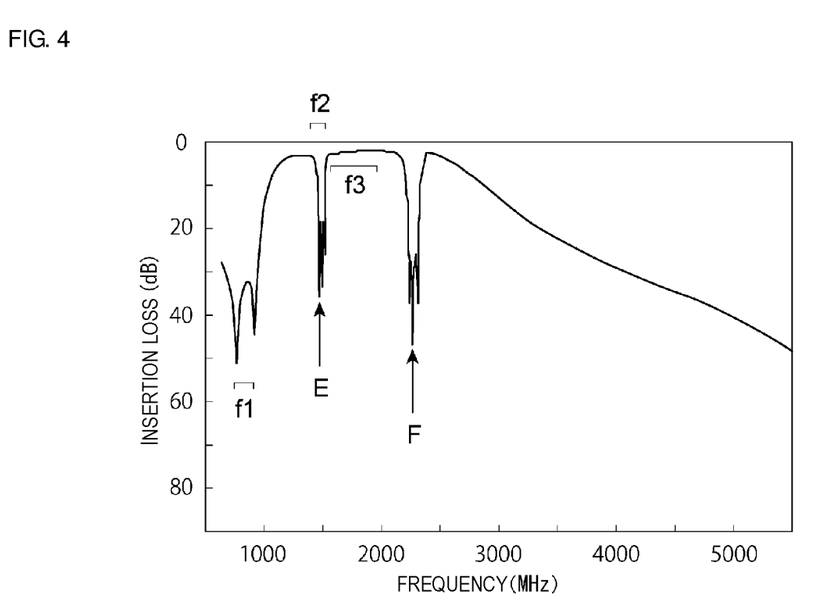
FIG. 4 illustrates a filter characteristic of a third filter circuit of the filter device of the first preferred embodiment of the present invention.

FIG. 2 illustrates a filter characteristic of the first filter circuit F1, FIG. 3 illustrates a filter characteristic of the second filter circuit and FIG. 4 illustrates a filter characteristic of the third filter circuit F3.

As illustrated in FIG. 2, in the first filter circuit, attenuation is small in the first pass band f1. In contrast, attenuation is sufficiently large in the second pass band f2 and the third pass band f3.

An arrow A below the second pass band f2 indicates the position of a trap due to the anti-resonant frequencies of the acoustic resonators used as the second capacitance elements 7b and 7c in the first filter circuit. In other words, since the anti-resonant frequencies of the acoustic resonators used as the second capacitance elements 7b and 7c are positioned at the frequency indicated by the arrow A, the attenuation in the second pass band f2 is able to be made sufficiently large.

In the first filter circuit F1, although the second capacitance elements 7b and 7c among the second capacitance elements 7a to 7c are preferably defined by acoustic resonators, it would be sufficient for at least one of the second capacitance elements to be defined by an acoustic resonator.

As illustrated in FIG. 3, in the filter characteristic of the second filter circuit F2, attenuation of the second pass band f2 is made sufficiently small. In contrast, sufficiently large attenuation is obtained in the first pass band f1 and the third pass band f3. These pass bands are obtained due to the band pass filter characteristics of the second filter circuit F2.

Since the second filter circuit F2 is preferably a band pass filter, the resonant frequencies of the series arm resonators S1 to S5 and the anti-resonant frequencies of the parallel arm resonators P1 to P4 are positioned at a position indicated by an arrow B, that is, inside the pass band f2. In addition, the characteristic of the frequency position indicated by an arrow C indicates an attenuation pole due to the resonant frequencies of the parallel arm resonators P1 to P4. An arrow D indicates an attenuation pole due to the anti-resonant frequencies of the series arm resonators S1 to S5.

Since the same or substantially the same acoustic resonators are preferably used as all the acoustic resonators that define the series arm resonators S1 to S5 and the parallel arm resonators P1 to P4, the resonant frequencies of the series arm resonators S1 to S5 and the anti-resonant frequencies of the parallel arm resonators P1 to P4 are located at the position indicated by the arrow B.

The resonant frequencies and anti-resonant frequencies of the series arm resonators S1 to S5 and the parallel arm resonators P1 to P4 defined by the acoustic resonators do not necessarily have to be the same or substantially the same.

As illustrated in FIG. 4, attenuation in the third pass band f3 is sufficiently small. In contrast, sufficiently large attenuation is obtained in the first pass band f1 and the second pass band f2. In other words, attenuation is sufficiently large in the first pass band f1 due to the high pass filter characteristics. On the other hand, the attenuation in the second pass band f2 is due to the anti-resonant frequencies of the third acoustic resonators 13a to 13c being positioned in the pass band f2, as illustrated by an arrow E. Thus, the attenuation is able to be made sufficiently large in the second pass band f2.

In addition, since the low pass filter 21 is connected, attenuation steadily increases at the high-frequency side of the third pass band f3. In addition, the resonant frequencies of the acoustic resonators used as the fifth capacitance elements 24a to 24c are positioned at the frequency indicated by an arrow F. Therefore, a trap is able to be provided at the position of the frequency indicated by the arrow F on the high-frequency side of the third pass band f3. Thus, traps having sufficiently large attenuation are able to be provided on the low-frequency side and the high-frequency side of the third pass band f3 and selectivity is able to be increased.

In addition, although the acoustic resonators used as the fifth capacitance elements 24a to 24c are provided in order to provide the traps, a trap is able to be provided as long as at least one acoustic resonator is provided.

It is sufficient that the third filter circuit F3 include the third acoustic resonator 13a, which is closest to the common terminal 2, among the third acoustic resonators 13a to 13c. The third acoustic resonators 13b and 13c may be omitted.

Figure 7:
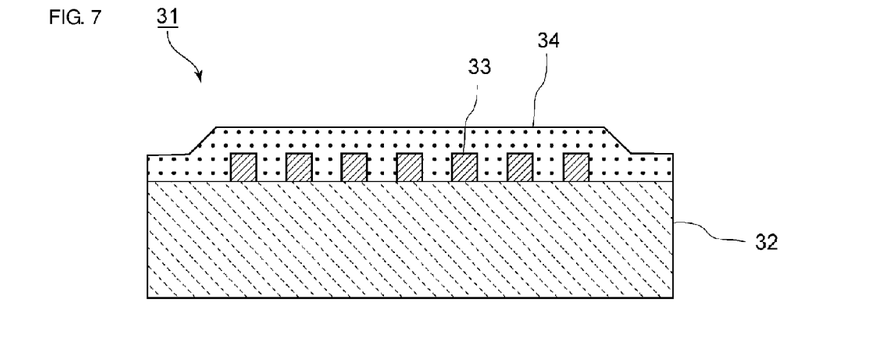
FIG. 7 is a front sectional view illustrating a surface acoustic wave resonator as an example of an acoustic resonator included in a preferred embodiment of the present invention.

As described above, the second capacitance element 7b is preferably defined by a surface acoustic wave resonator, for example. The structure of this surface acoustic wave resonator is not particularly limited. For example, a surface acoustic wave resonator 31 illustrated in FIG. 7 may preferably be used. An IDT electrode 33 is provided on a piezoelectric substrate 32 in the surface acoustic wave resonator 31. Although not particularly limited to this configuration, a dielectric film 34 composed of $SiO_2$ is preferably provided so as to cover the IDT electrode 33. The magnitude of the response in the resonance characteristic of the acoustic resonator described above is able to be adjusted by adjusting the film thickness and material of the dielectric film 34. In addition, the frequency positions of the resonant frequency and the anti-resonant frequency are also able to be adjusted by adjusting the metal that is used for the IDT electrode and the film thickness thereof.

In addition, although it is described that a surface acoustic wave resonator is preferably used as the acoustic resonator in the above-described preferred embodiment, an acoustic resonator other than a surface acoustic wave resonator may be used instead. For example, a boundary acoustic wave resonator may be used. Furthermore, a BAW resonator may be used in which bulk waves that propagate through a piezoelectric thin film are utilized. In addition, a piezoelectric resonator that includes a single-layer piezoelectric substrate or a multilayer piezoelectric body may be used.

Figure 5:
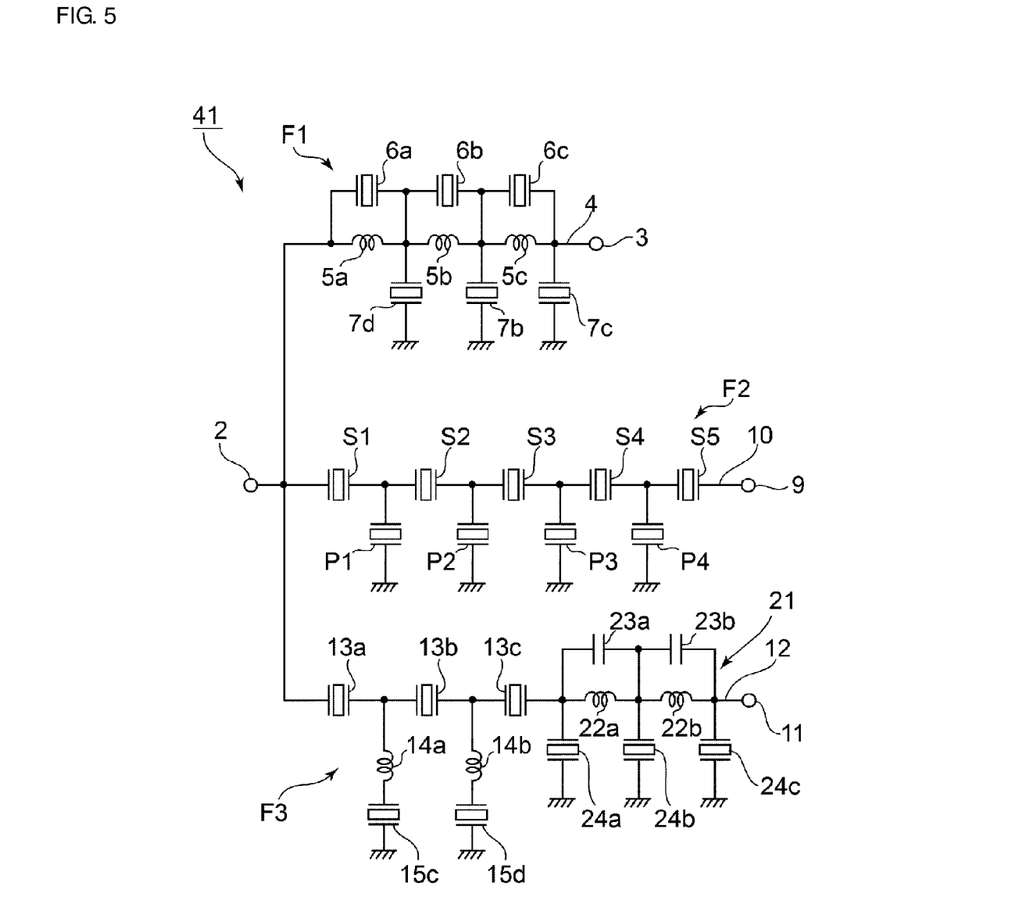
FIG. 5 is a circuit diagram of a filter device according to a second preferred embodiment of the present invention.

FIG. 5 is a circuit diagram of a filter device according to a second preferred embodiment of the present invention. In the first filter circuit F1, the first capacitance elements 6a to 6c are preferably defined by acoustic resonators. In addition, a second capacitance element 7d, which is preferably defined by an acoustic resonator, is connected between a connection point between the first inductor 5a and the first inductor 5b, and the ground potential.

In addition, in the third filter circuit F3, third capacitance elements 15c and 15d are preferably defined by acoustic resonators. The rest of the configuration of a filter device 41 preferably is the same or substantially the same as that of the filter device 1.

As described above, the first capacitance elements 6a to 6c may be preferably be defined by acoustic resonators, and all of the capacitance elements that are arranged along paths that connect the first signal line 4 and the ground potential in the first filter circuit F1 may preferably be acoustic resonators.

Furthermore, as illustrated in FIG. 5, acoustic resonators may preferably be used as the fifth capacitance elements 24a to 24c in paths that connect the third signal line 12 and the ground potential in the third filter circuit F3 as well. The filter device 41 achieves the same or substantially the same operational effects as the filter device 1 by utilizing the capacitances of the acoustic resonators.

In addition, in the case where acoustic resonators are used, attenuation in the second pass band f2 is able to be increased by causing the anti-resonant frequencies of the acoustic resonators connected to the third signal line 12 to be located in the second pass band f2. Furthermore, the attenuation in the second pass band f2 is able to be increased by causing the anti-resonant frequencies of the acoustic resonators provided in the paths that connect the third signal line 12 and the ground potential to be located in the second pass band f2.

Figure 6:
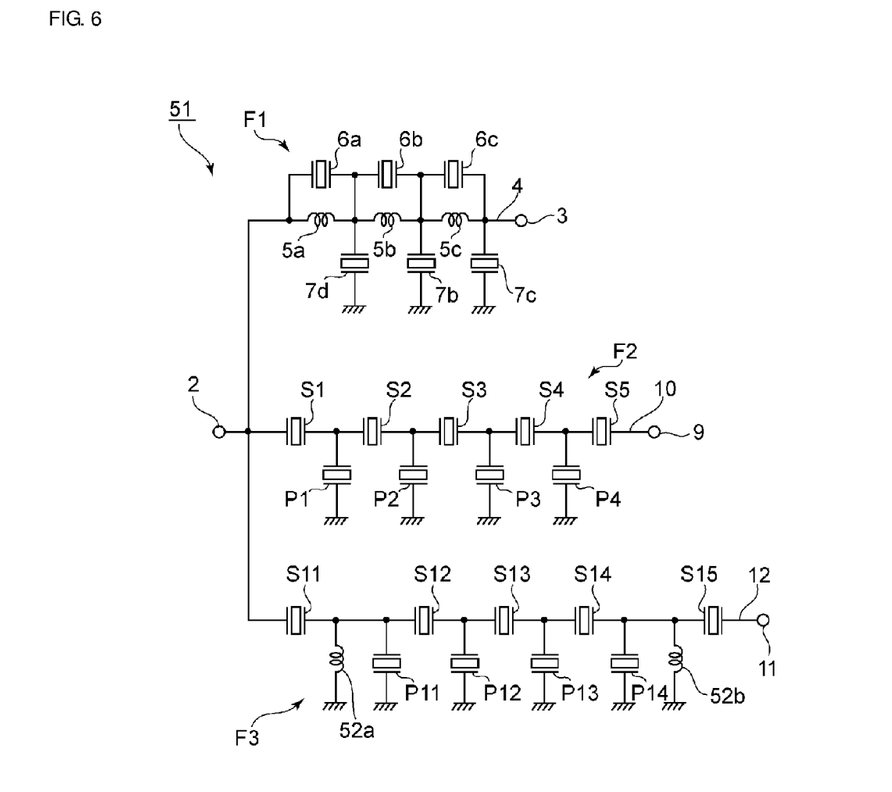
FIG. 6 is a circuit diagram of a filter device according to a third preferred embodiment of the present invention.

FIG. 6 is a circuit diagram of a filter device 51 according to a third preferred embodiment of the present invention. In the filter device 51 according to the third preferred embodiment, the first and second filter circuits F1 and F2 have the same or substantially the same configurations as in the filter device 41 of the second preferred embodiment. This preferred embodiment is different in that the third filter circuit F3 is a band pass filter, which is preferably defined by a ladder filter.

That is, series arm resonators S11 to S15 are connected in series with each other along the third signal line 12, which connects the common terminal 2 and the third terminal 11 to each other. A parallel arm resonator P11 is provided in a parallel arm that connects a connection point between the series arm resonators S11 and S12 and the ground potential. A parallel arm resonator P12 is provided between a connection point between the series arm resonators S12 and S13 and the ground potential. A parallel arm resonator P13 is provided between a connection point between the series arm resonators S13 and S14 and the ground potential. A parallel arm resonator P14 is provided in a parallel arm that connects a connection point between the series arm resonators S14 and S15 and the ground potential.

Furthermore, an inductor 52a is connected between a connection point between the series arm resonator S11 and the series arm resonator S12, and the ground potential. An inductor 52b is connected between a connection point between the series arm resonator S14 and the series arm resonator S15, and the ground potential. The inductors 52a and 52b are provided in order to adjust impedance.

Thus, the third filter circuit F3 may preferably be a band pass filter as in the filter device 51.

The series arm resonators S11 to S15 and the parallel arm resonators P11 to P14 are preferably defined by acoustic resonators, which have resonant frequencies and anti-resonant frequencies. In the filter device 51, the closest element to the common terminal 2 in the third filter circuit F3 is the series arm resonator S11. That is, the closest element to the common terminal 2 is a third acoustic resonator and is provided along the third signal line 12.

In the filter device 51, the closest element to the common terminal 2 in the first filter circuit F1 is the first inductor 5a provided on the first signal line 4, and the closest elements to the common terminal 2 in the second and third filter circuits F2 and F3 are the series arm resonator S1 and the series arm resonator S11 which are defined by acoustic resonators, respectively, these resonators being respectively arranged along the second and third signal lines 10 and 12. Therefore, there is no need to provide impedance matching circuits on the common terminal 2 side of the device. Consequently, the filter device 51 is also able to also achieve reductions in size and cost.

Furthermore, in preferred embodiments of the present invention, the first, second and third filter circuits F1, F2 and F3 are able to be suitably modified as is clear from the first, second and third preferred embodiments. In other words, the number of filter circuit stages and the number of elements in the first, second and third filter circuits F1, F2 and F3 are not limited to what is described in the preferred embodiments of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a common terminal;
a first filter circuit that includes a first signal line that is connected to the common terminal and is a low pass filter with a first pass band;
a second filter circuit that includes a second signal line that is connected to the common terminal and is a band pass filter with a second pass band that is located at a higher frequency than the first pass band of the first filter circuit; and
a third filter circuit that includes a third signal line that is connected to the common terminal and includes a third pass band that is located at a higher frequency than the second pass band of the second filter circuit; wherein
the first filter circuit includes a first inductor that is closest to the common terminal along the first signal line and a first capacitance element that is connected in parallel with the first inductor and defines an LC resonance circuit;
the second filter circuit includes a second acoustic resonator that is closest to the common terminal along the second signal line; and
the third filter circuit includes a third acoustic resonator that is closest to the common terminal along the third signal line.

2. The filter device according to claim 1, wherein the first filter circuit includes a first acoustic resonator that includes an anti-resonant frequency and a resonant frequency, the resonant frequency being located inside the second pass band, and a second capacitance element that is connected between the first signal line and a ground potential.

3. The filter device according to claim 2, wherein the second capacitance element of the first filter circuit includes an acoustic resonator;
the second filter circuit includes a parallel arm that connects the second signal line, which is a series arm, and the ground potential, and an acoustic resonator is provided in the parallel arm; and
a resonant frequency of the acoustic resonator that defines the second capacitance element of the first filter circuit and a resonant frequency of the acoustic resonator provided in the parallel arm of the second filter circuit are the same or substantially the same as a resonant frequency of the second acoustic resonator.

4. The filter device according to claim 3, wherein the resonant frequency of the second acoustic resonator, the resonant frequency of the acoustic resonator that defines the second capacitance element of the first filter circuit, and the resonant frequency of the acoustic resonator provided in the parallel arm of the second filter circuit are within a range of about ±5% of an average value of the resonant frequencies of the acoustic resonators.

5. The filter device according to claim 1, wherein the second filter circuit is a ladder filter that includes the second acoustic resonator and a fourth acoustic resonator that is provided in a parallel arm that connects the second signal line and a ground potential.

6. The filter device according to claim 1, wherein the third filter circuit is an LC filter that includes a second inductor that is connected between the third signal line and the ground potential, and a third capacitance element that is connected in series with the second inductor.

7. The filter device according to claim 1, wherein the third filter circuit is a band pass filter.

8. The filter device according to claim 7, wherein the third filter circuit is a ladder filter.

9. The filter device according to claim 2, wherein at least one of the first, second and third acoustic resonators is an elastic wave resonator.

10. The filter device according to claim 9, wherein the elastic wave resonator is a surface acoustic wave resonator.

11. The filter device according to claim 1, wherein the first capacitance element includes an acoustic resonator.

12. The filter device according to claim 2, wherein the second capacitance element provides impedance adjustment.

13. The filter device according to claim 1, wherein the second filter circuit includes a plurality of series arm resonators provided along the second signal line.

14. The filter device according to claim 13, wherein the second filter circuit includes a plurality of parallel arm resonators in parallel arms connected to connection points between the plurality of series arm resonators and a ground potential.

15. The filter device according to claim 1, further comprising a low pass filter connected between the third filter circuit and a third terminal along the third signal line.

16. The filter device according to claim 15, wherein the third filter circuit is a high pass filter.

17. The filter device according to claim 15, wherein the low pass filter includes an inductor provided along the third signal line, and a capacitance element connected in parallel with the inductor.

18. The filter device according to claim 1, wherein an anti-resonant frequency of the third acoustic resonator of the third filter circuit is located in the second pass band of the second filter circuit.

* * * * *